(12) United States Patent
Cho et al.

(10) Patent No.: US 10,916,575 B2
(45) Date of Patent: Feb. 9, 2021

(54) IMAGE SENSOR AND METHOD OF MANUFACTURING IMAGE SENSOR

(71) Applicants: Samsung Electronics Co., Ltd., Suwon-si (KR); Korea Advanced Institute of Science and Technology, Daejeon (KR)

(72) Inventors: Yang Ho Cho, Seongnam-si (KR); Ki-Hun Jeong, Daejeon (KR); Dong Kyung Nam, Yongin-si (KR); Kisoo Kim, Daejeon (KR); Kyung-Won Jang, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/353,301

(22) Filed: Mar. 14, 2019

(65) Prior Publication Data

US 2019/0312072 A1    Oct. 10, 2019

(30) Foreign Application Priority Data

Apr. 4, 2018   (KR) .................. 10-2018-0039290
Jun. 27, 2018  (KR) .................. 10-2018-0074099

(51) Int. Cl.
*H01L 27/146*   (2006.01)
*G02B 7/00*     (2006.01)
(Continued)

(52) U.S. Cl.
CPC ........ *H01L 27/14623* (2013.01); *G02B 5/003* (2013.01); *G02B 7/003* (2013.01);
(Continued)

(58) Field of Classification Search
CPC ......... H01L 27/14623; H01L 27/14627; H01L 27/14625
See application file for complete search history.

(56) References Cited

U.S. PATENT DOCUMENTS 5,514,888 A *  5/1996  Sano ................. H01L 27/14623
                                                  257/232
7,009,652 B1   3/2006  Tanida et al.
(Continued)

FOREIGN PATENT DOCUMENTS

CN    105556674 A    5/2016
EP    0 576 144 A1   12/1993
(Continued)

OTHER PUBLICATIONS

Partial European Search Report dated Jul. 16, 2019 in counterpart European Patent Application No. 19163968.1 (14 pages in English).
(Continued)

*Primary Examiner* — Changhyun Yi
(74) *Attorney, Agent, or Firm* — NSIP Law

(57) ABSTRACT

An image sensor and a method of manufacturing the image sensor are provided. The image sensor includes a block layer including an absorption layer and a transparent layer that are alternately stacked, a lens element is located below the block layer, and a sensing element is located to face the lens element.

30 Claims, 14 Drawing Sheets

(51) Int. Cl.
  *G02B 7/02* (2006.01)
  *G02B 5/00* (2006.01)
  *G02B 3/00* (2006.01)

(52) U.S. Cl.
  CPC .......... *G02B 7/02* (2013.01); *H01L 27/14618* (2013.01); *H01L 27/14625* (2013.01); *H01L 27/14627* (2013.01); *H01L 27/14645* (2013.01); *H01L 27/14685* (2013.01); *G02B 3/0018* (2013.01)

(56) References Cited

U.S. PATENT DOCUMENTS

| | | | |
|---|---|---|---|
| 7,412,107 B2 | 8/2008 | Milanfar et al. | |
| 7,724,439 B2 | 5/2010 | Li et al. | |
| 7,897,903 B2 | 3/2011 | Duparre et al. | |
| 7,940,282 B2 | 5/2011 | Milanfar et al. | |
| 8,237,841 B2 | 8/2012 | Tanida et al. | |
| 9,305,951 B2 | 4/2016 | Kang et al. | |
| 9,485,397 B2 | 11/2016 | Rudmann et al. | |
| 2008/0142686 A1 | 6/2008 | Konno et al. | |
| 2009/0002531 A1* | 1/2009 | Godaiin ............ H01L 27/14641 348/294 |
| 2010/0032781 A1 | 2/2010 | Ryu | |
| 2011/0122308 A1 | 5/2011 | Duparre | |
| 2012/0230669 A1 | 9/2012 | Abe | |
| 2017/0078568 A1 | 3/2017 | Venkataraman et al. | |
| 2017/0111558 A1 | 4/2017 | Brueckner et al. | |
| 2017/0158646 A1 | 6/2017 | Grammenos et al. | |
| 2018/0152692 A1 | 5/2018 | Cho et al. | |

FOREIGN PATENT DOCUMENTS

| | | |
|---|---|---|
| EP | 0 840 502 A2 | 5/1998 |
| JP | 4743296 B2 | 8/2011 |
| JP | 2013-55202 A | 3/2013 |
| JP | 6248457 B2 | 12/2017 |
| KR | 10-2014-0143867 A | 12/2004 |
| KR | 10-0880070 B1 | 1/2009 |
| KR | 10-2016-0139266 A | 12/2016 |
| WO | WO 2009/146253 A1 | 12/2009 |
| WO | WO 2014/042178 A1 | 3/2014 |

OTHER PUBLICATIONS

Extended European Search Report dated Sep. 4, 2019 in counterpart European Patent Application No. 19163968.1 (12 pages in English).

* cited by examiner

FIG. 15
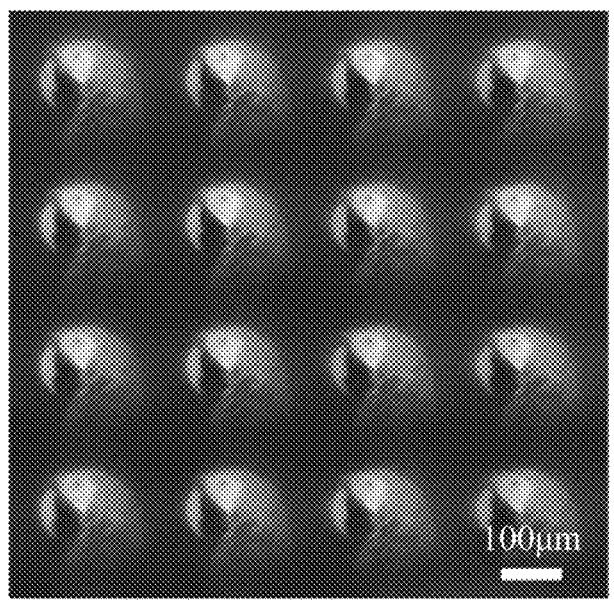

IMAGE SENSOR AND METHOD OF MANUFACTURING IMAGE SENSOR

CROSS-REFERENCE TO RELATED APPLICATIONS

This application claims the benefit under 35 USC § 119(a) of Korean Patent Application No. 10-2018-0039290, filed on Apr. 4, 2018, and Korean Patent Application No. 10-2018-0074099, filed on Jun. 27, 2018, in the Korean Intellectual Property Office, the entire disclosures of which are incorporated herein by reference for all purposes.

BACKGROUND

1. Field

The following description relates to an image sensor, and a method of manufacturing the image sensor.

2. Description of Related Art

Image sensors are devices configured to capture an image of a subject, and may convert an optical signal including image information of the subject into an electrical signal. Image sensors are included in various electronic devices. For example, image sensors such as, charge coupled device (CCD) image sensors, and complementary metal-oxide-semiconductor (CMOS) image sensors are widely used.

A CMOS image sensor includes a plurality of pixels including a plurality of transistors and a photoelectric conversion device. A signal that is photoelectrically converted by the photoelectric conversion device may be processed and output by the plurality of transistors, and image data may be generated based on a pixel signal output from a pixel. Each of the pixels may photoelectrically convert a color or light in a wavelength range, to generate and output a signal.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an image sensor including a block layer including an absorption layer and a transparent layer, and the block layer being configured to transmit light through an aperture formed in the absorption layer and the transparent layer, and a lens element configured to transfer the light to a sensing element.

The sensing element may be spaced apart from the lens element, and the sensing element is configured to receive the light passing through the aperture and the lens element.

The lens element may be configured to refract the light and to form a focal point on the sensing element.

The block layer may be spaced apart by a focal length of the lens element from the sensing element.

The image sensor may include a transparent substrate configured to transmit light.

The aperture may be located in the block layer to correspond to an arrangement of the lens element.

The image sensor may include a spacer configured to maintain an interval between the block layer and the sensing element.

The absorption layer and the transparent layer may be alternately disposed in the block layer.

The absorption layer may include a circular iris diaphragm centered on a point corresponding to the lens element.

The absorption layer may include an iris diaphragm with a first diameter centered on a point corresponding to the lens element, and the block layer may include another absorption layer with another iris diaphragm with a second diameter different from the first diameter.

A diameter of the aperture may gradually change from one surface to another surface of the block layer.

The transparent layer may be configured to transmit light in a wavelength band.

The block layer may have a height based on a field of view (FOV).

A number of absorption layers stacked in the block layer may be determined based on a field of view (FOV).

A diameter of the aperture may be based on a quantity of the light, and the block layer may be spaced apart from the sensing element by a focal length determined based on the quantity of the light.

The transparent layer may include a transparent polymer configured to transmit light.

The absorption layer may include a black matrix material configured to absorb light.

The block layer may include a plurality of absorption layers, and a circular iris diaphragm formed in each of the plurality of absorption layers may have a diameter that is determined based on a field of view (FOV) and a refractive index determined by the transparent layer and a transparent substrate disposed on the block layer.

The lens element and the sensing element may be arranged in a planar array pattern, and the absorption layer may include an iris diaphragm arranged based on the planar array pattern.

The transparent substrate may be disposed on a first side of the block layer and the lens element may be disposed on a second side of the block layer, opposing the first side.

In another general aspect, there is provided a method of manufacturing an image sensor, the method including providing a transparent substrate, providing a block layer including an absorption layer and a transparent layer, and providing a lens element based on a pattern of apertures formed in the block layer.

In another general aspect, there is provided a method of manufacturing an image sensor, the method including disposing a block layer including an absorption layer and a transparent layer on a transparent substrate, and providing a lens element corresponding to a pattern of apertures formed in the block layer.

The disposing of the block layer may include coating the transparent substrate with an opaque polymer, disposing a mask with the pattern on a portion of the opaque polymer, emitting ultraviolet (UV) rays to the opaque polymer exposed through the pattern of the mask, removing the portion of the opaque polymer covered with the mask, coating a transparent layer, the transparent layer may include a negative photoresist, over and between a remaining opaque polymer, and exposing the transparent layer to UV rays.

The method may include increasing a bonding between the transparent layer and the remaining opaque polymer by performing a hydrophilic process.

The mask may include a circular mask with a grid pattern.

The coating may include a negative photoresist.

The providing of the lens element may include coating a thermoplastic polymer layer, the thermoplastic polymer layer may include a positive photoresist, on the block layer, disposing a mask with the pattern on a portion of the thermoplastic polymer layer, exposing the thermoplastic polymer layer to ultraviolet (UV) rays through the pattern of the mask, dissolving the thermoplastic polymer layer exposed to UV rays by a developer, applying a hydrophobic coating to the patterned thermoplastic polymer layer, and heating the coated thermoplastic polymer layer to form spherical lenses.

The thermoplastic polymer layer may include a transparent material moldable by heat.

In another general aspect, there is provided an image sensor including a block layer including absorption layers and transparent layers alternatively stacked together, an aperture formed in the absorption layers and the transparent layer to transfer light to a lens element, and a sensing element spaced apart from the lens element, and being configured to receive the light from the lens element.

A diameter of the aperture may gradually changes between two opposing surfaces of the block layer.

The aperture may include circular openings in each of the absorption layers, and a diameter of the circular openings are based on a field of view (FOV) and a refractive index determined by the transparent layers and a transparent substrate disposed on the block layer.

The image sensor may include a spacer located at an outer boundary of the block layer and the sensing element, the spacer being configured to maintain an interval substantially equal to a focal length of the lens element between the block layer and the sensing element.

Other features and aspects will be apparent from the following detailed description, the drawings, and the claims.

BRIEF DESCRIPTION OF THE DRAWINGS

FIG. 15 illustrates an example of an image acquired by an image sensor.

Figure 1:
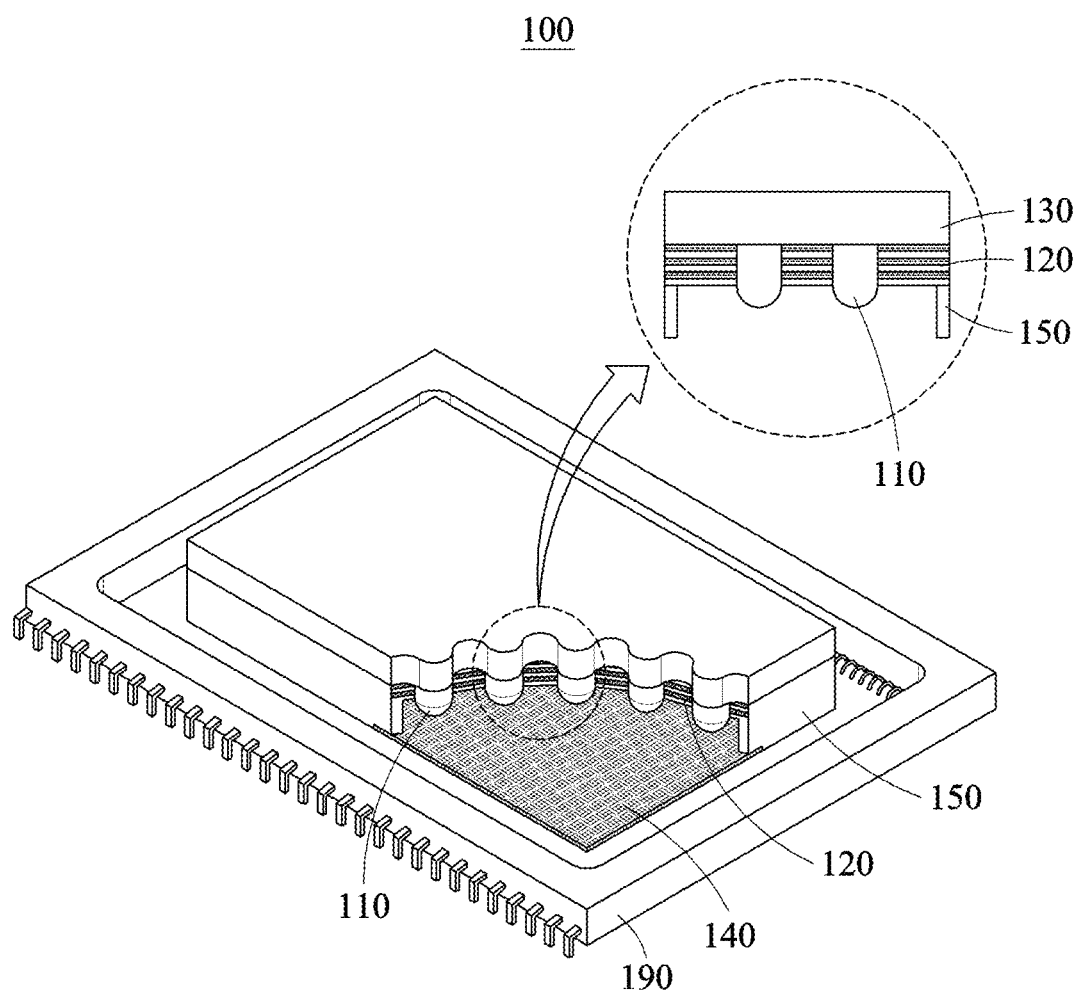
FIG. 1 illustrates an example of a configuration of an image sensor.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinafter, examples will be described in detail with reference to the accompanying drawings. The scope of the right, however, should not be construed as limited to the examples set forth herein. Various modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not intended to be limiting. As used herein, the singular forms are intended to include the plural forms as well, unless the context clearly indicates otherwise. As used herein, the term "and/or" includes any one and any combination of any two or more of the associated listed items.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure. It will be understood that when a component is referred to as being "connected to"

another component, the component can be directly connected or coupled to the other component or intervening components may be present.

The use of the term 'may' herein with respect to an example or embodiment, e.g., as to what an example or embodiment may include or implement, means that at least one example or embodiment exists where such a feature is included or implemented while all examples and embodiments are not limited thereto.

Regarding the reference numerals assigned to the elements in the drawings, it should be noted that the same elements will be designated by the same reference numerals, wherever possible, even though they are shown in different drawings. Also, in the description of examples, detailed description of well-known related structures or functions will be omitted when it is deemed that such description will cause ambiguous interpretation of the present disclosure.

FIG. 1 illustrates an example of a configuration of an image sensor 100.

The image sensor 100 is an apparatus for capturing an image of a subject. In an example, the image sensor 100 includes a lens element 110, a block layer 120, a transparent substrate 130, a sensing element 140, a spacer 150, and a camera chip 190.

The lens element 110 is an element to refract light received from the outside, and concentrates light. The lens element 110 refracts light to form a focal point on the sensing element 140. In an example, one surface of the lens element 110 has a protrusion and another surface is a flat surface. In an example, the lens element 110 is a microlens having a convex surface. Other shapes of the surface of the lens element 110 with the protrusion, such as, for example a spherical shape, an aspherical shape, a concave lens, or a Fresnel shape may be used without departing from the spirit and scope of the illustrative examples described.

A set of lens elements 110 is referred to as a lens array. For example, the lens array includes a plurality of lens elements arranged in a planar array pattern, such as, for example, a grid pattern.

The block layer 120 is a layer to block light. In an example, the block layer 120 includes a transparent layer, and an absorption layer in which a pattern (for example, a hole pattern) is formed. In an example, the block layer 120 includes an aperture formed by the pattern of the absorption layer. The block layer 120 transfers light received from the outside to the lens element 110 through the aperture. Examples of the transparent layer and the absorption layer included in the block layer 120 will be further described below with reference to FIGS. 2 and 3.

The transparent substrate 130 is a transparent substrate configured to transmit light. In an example, the transparent substrate 130 is disposed on the block layer 120. However, an arrangement of the transparent substrate 130 is not limited thereto, and the transparent substrate 130 is also located on the lens element 110 located on the block layer 120. In an example, the transparent substrate 130 includes a glass wafer, however, a type of the transparent substrate 130 is not limited thereto. Other types of transparent substrate 130 may be used without departing from the spirit and scope of the illustrative examples described.

In an example, the sensing element 140 is spaced apart from the lens element 110, and receives light passing through the aperture of the block layer 120 and the lens element 110. The sensing element 140 receives light concentrated by the lens element 110 after the light passes through the transparent substrate 130 and the aperture of the block layer 120. The sensing element 140 outputs a signal indicating an intensity of the received light. In an example, the sensing element 140 senses light corresponding to a color channel and outputs a signal indicating an intensity of a corresponding color. A color channel is a channel representing a color corresponding to a portion of a visible region, and includes, for example, a red channel, a green channel and a blue channel. In an example, an individual sensing element 140 senses light corresponding to one color channel among a red channel, a green channel and a blue channel. A wavelength sensible by the sensing element 140 is not limited to the visible region. In other examples, the sensing element 140 may sense infrared rays or ultraviolet rays depending on a design.

A set of sensing elements 140 is referred to as a sensor array. For example, a sensor array includes a plurality of sensing elements arranged in a planar array pattern (for example, a grid pattern). In an example, the sensor array includes a sensing element 140 sensing red, a sensing element 140 sensing green, and a sensing element 140 sensing blue. In an example, the sensor array distinguishably senses three colors.

The spacer 150 maintains an interval between the block layer 120 and the sensing element 140. For example, the spacer 150 supports the block layer 120 and the sensing element 140. As shown in FIG. 1, in an example, the spacer 150 is located along an outer boundary of the sensor array, and supports an outer boundary of the block layer 120.

The camera chip 190 is a chip in which a sensor array is implemented. The camera chip 190 is implemented in, for example, a wafer level.

In an example, the lens element 110, the block layer 120, the transparent substrate 130, the sensing element 140, the spacer 150, and the camera chip 190 are bonded through an integration process.

Figure 2:
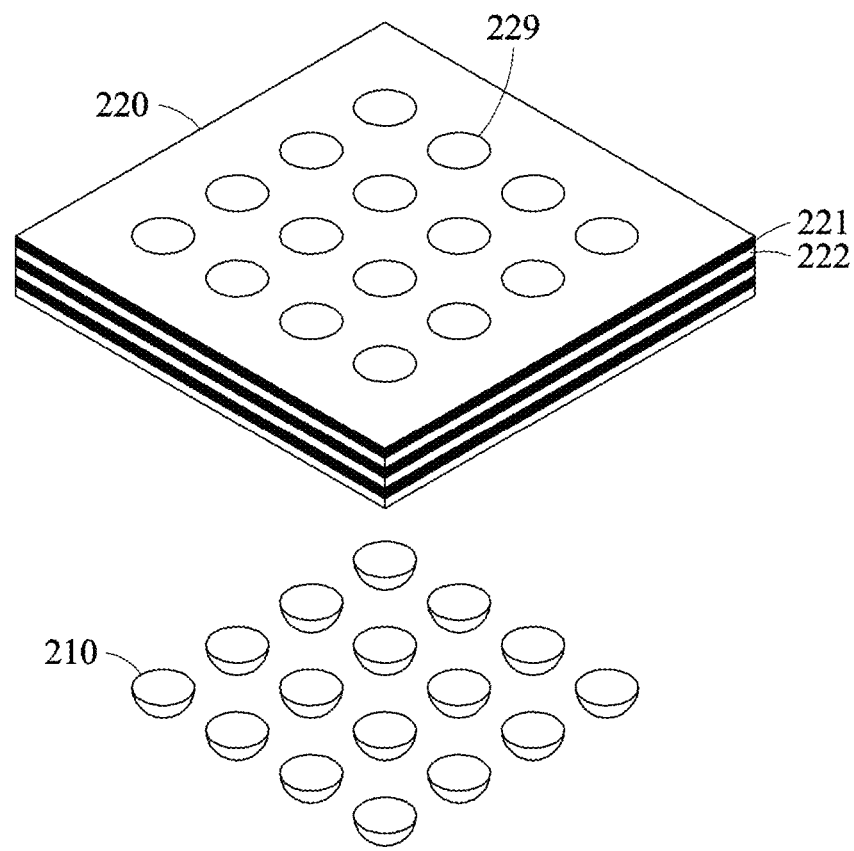
FIG. 2 illustrates an example of a block layer and a lens element.

FIG. 2 illustrates an example of a block layer 220 and a lens element 210.

The block layer 220 includes an absorption layer 221 and a transparent layer 222. The block layer 220 transmits light received from the outside through an aperture 229 formed in the absorption layer 221 and the transparent layer 222. In an example, the block layer 220 provides light received from the outside to the lens element 210 through the aperture 229.

The absorption layer 221 is a layer to absorb light, and is rereferred to as, for example, a "photoabsorption layer." In an example, the absorption layer 221 includes a black matrix material that absorbs light. The black matrix material includes, for example, Black SU-8. However, a material of the absorption layer 221 is not limited thereto, and in another example the absorption layer 221 includes a negative photoresist that absorbs light. In an example, the absorption layer 221 includes a circular iris diaphragm formed centered on a point corresponding to the lens element 210 based on an arrangement of the lens element 210. The absorption layer 221 includes an iris diaphragm formed and arranged based on a planar array pattern.

The transparent layer 222 is a layer to transmit light. In an example, the transparent layer 222 includes a transparent polymer that transmits light. The transparent polymer includes, for example, SU-8. However, a material of the transparent layer 222 is not limited thereto, and the transparent layer 222 includes any negative photoresist that transmits light. In an example, the transparent layer 222 transmits light in a wavelength band. In another example, the transparent layer 222 transmits light in a visible light band.

In an example, the block layer 220 forms the aperture 229 by a structure in which the absorption layer 221 and the transparent layer 222 are alternately disposed. In an example, a surface of the block layer 220 on which the absorption layer 221 is located is opposite to a surface of the block layer 220 on which the lens element 210 is located. However, an arrangement of the absorption layer 221 is not limited thereto, and the absorption layer 221 and the lens element 210 are located on the same surface.

Circular iris diaphragms are formed in a grid pattern in the absorption layer 221. For example, when the block layer 220 includes a plurality of absorption layers, iris diaphragms of the plurality of absorption layers form the aperture 229. The aperture 229 is a portion of the block layer 220 through which light passes. The aperture 229 is formed based on an arrangement of the lens element 210 in the block layer 220. The aperture 229 will be further described below with reference to FIG. 3.

The lens element 210 transfers light received from the outside to a sensing element. In an example, the lens element 210 is located below the block layer 220, and transmits light provided through the aperture 229. In an example, a protrusion is formed on one surface of the lens element 210, and the protrusion is located so that the protrusion faces a sensing element. For example, the lens element 210 transfers light provided through the aperture 229 to a sensing element corresponding to the aperture 229. However, the above-described structure is merely an example, and examples are not limited thereto. In another example, the lens element 210 is located above the block layer 220, instead of being located below the block layer 220, or lens elements 210 are located above and below the block layer 220. In another example, a flat portion of the lens element 210, instead of the protrusion, is located to face the sensing element. In another example, the lens element 210 has a concave portion, instead of the protrusion, formed on the surface.

A pattern (for example, a hole pattern) formed in the block layer 220 allows light passing through an aperture 229 in the block layer 220 to be transferred to a sensing element corresponding to the aperture 229, and prevents the light from traveling towards another sensing element. Thus, the block layer 220 having the pattern reduces optical crosstalk. Also, a wide field of view (FOV) of an image sensor is designed based on, for example, a diameter of a hole pattern, or a height of the block layer 220.

Figure 3:
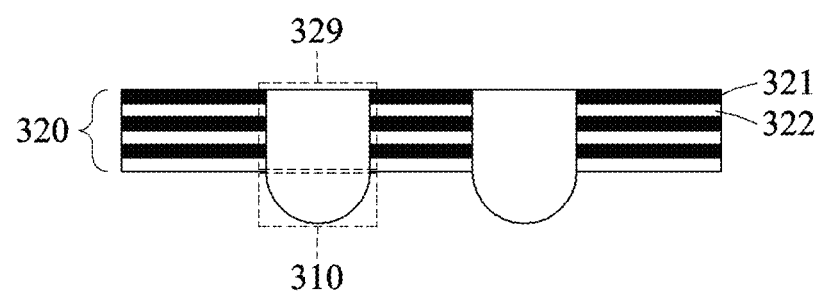
FIG. 3 illustrates an example of a cross section of a block layer and a lens element.

FIG. 3 illustrates an example of a cross section of a block layer 320 and a lens element 310.

An image sensor includes the lens element 310 located below the block layer 320, and the block layer 320 in which an aperture 329 is formed. As shown in FIG. 3, the block layer 320 has a structure in which an absorption layer 321 and a transparent layer 322 are alternately stacked. An individual absorption layer 321 includes a circular iris diaphragm, and the circular iris diaphragm is filled with the same material as that of the transparent layer 322.

In the absorption layer 321, a region in which an iris diaphragm is formed transmits light, and the other regions in which the iris diaphragm is not formed absorb light. Light passing through an iris diaphragm of an arbitrary absorption layer 321 passes through a next transparent layer 322. Light passing through the next transparent layer 322 passes through an iris diaphragm of a next absorption layer. Thus, an iris diaphragm of each of a plurality of absorption layers forms an aperture 329 that has a cylindrical shape and that transmits light received from the outside.

Light passing through the aperture 329 is provided to the lens element 310. The lens element 310 concentrates the light passing through the aperture 329 and transfers the light to a sensing element.

Figure 4:
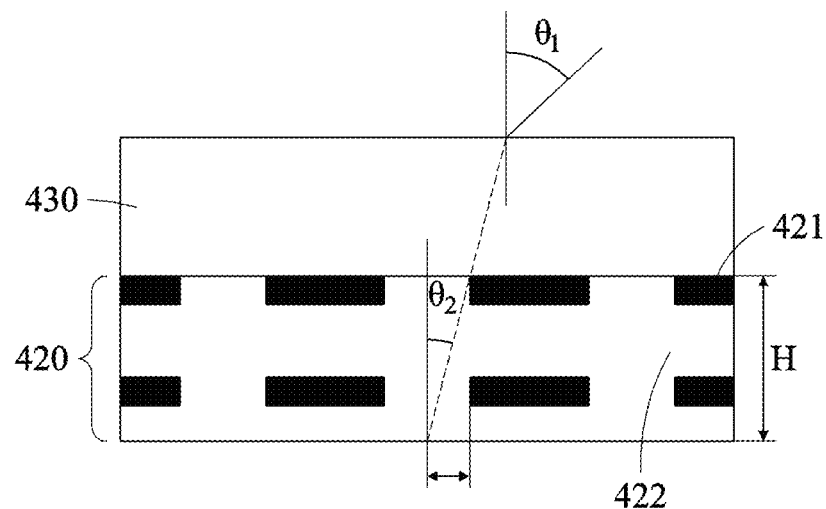
FIG. 4 illustrates an example of a field of view (FOV) of an image sensor.

FIG. 4 illustrates an example of a FOV of an image sensor.

A block layer 420 has a height H determined based on a FOV. For example, the FOV of the image sensor represents a maximum angle $\theta_1$ of incidence with respect to a transparent substrate 430 at which light received from the outside reaches a sensing element. Light incident to the transparent substrate 430 is refracted based on a refractive index of each of the transparent substrate 430 and a transparent layer 422. For example, in FIG. 4, light is assumed to be incident to the transparent substrate 430 at an angle $\theta_1$. Because light is absorbed by an absorption layer 421 in the block layer 420, a maximum angle $\theta_2$ that allows light to pass through the block layer 420 by an aperture is determined. For example, maximum angle $\theta_2$ that allows light received from the outside to pass through the block layer 420 is determined based on a height and a diameter of an aperture formed in the block layer 420. The height of the aperture corresponds to the height H of the block layer 420.

In an example, a relationship between the angles $\theta_1$ and $\theta_2$ and the height H of the block layer 420 in the image sensor is shown in Table 1 below.

TABLE 1

| H (μm) | $\theta_2$ (°) | $\theta_1$ (°) |
|---|---|---|
| 120 | 22.61 | 33.92 |
| 110 | 24.44 | 36.66 |
| 100 | 26.56 | 39.84 |
| 90 | 29.054 | 43.58 |
| 80 | 32.00 | 48.00 |
| 70 | 35.53 | 53.30 |
| 60 | 39.80 | 59.70 |
| 50 | 45 | 67.5 |
| 40 | 51.340 | 77.01 |
| 30 | 59.036 | 88.55 |
| 20 | 68.198 | 77.7 |

In Table 1, when the height H of the block layer 420 is 110 μm, the FOV of the image sensor is about 70°.

However, a configuration of the block layer 420 is not limited to the above description. A number of absorption layers 421 stacked in the block layer 420 is determined based on a FOV. For example, a height of the block layer 420 is determined based on a FOV, and the number of absorption layers 421 that are stacked is determined based on an interval between the absorption layers 421 and the height of the block layer 420. The interval between the absorption layers 421 corresponds to a thickness of the transparent layer 422.

Figure 5:
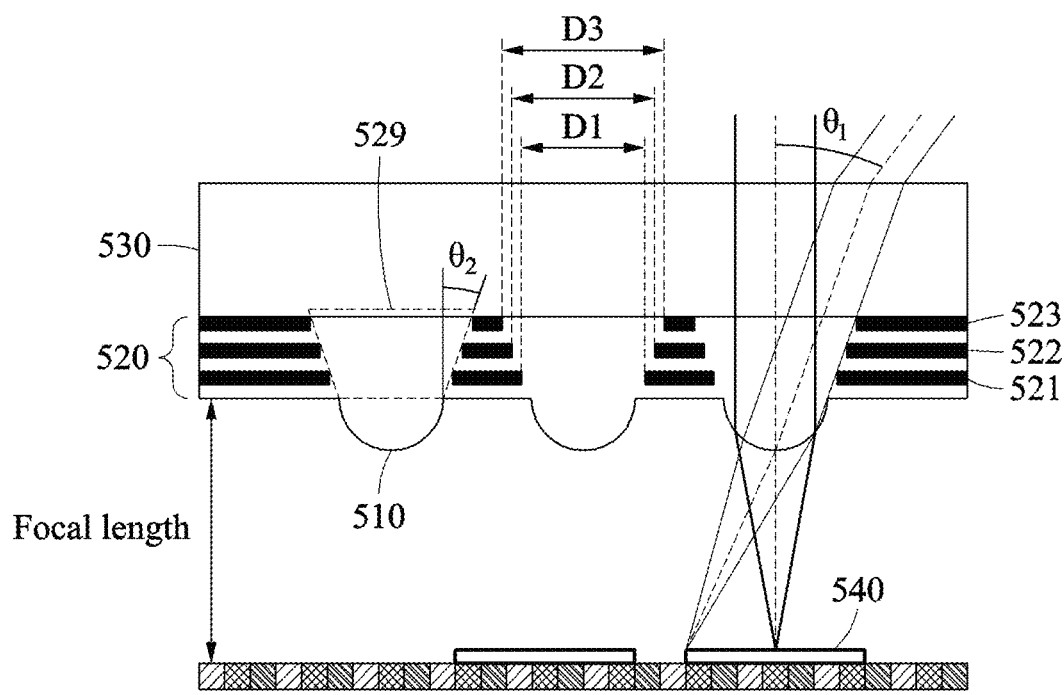
FIG. 5 illustrates an example of a FOV determined by an aperture of a block layer.

FIG. 5 illustrates an example of a FOV determined by an aperture of a block layer.

In an example, a block layer 520 includes an absorption layer 521 that includes an iris diaphragm with a first diameter D1 formed centered on a point corresponding to a lens element 510. The block layer 520 includes a second absorption layer, i.e., an absorption layer 522 that includes an iris diaphragm with a second diameter D2 different from the first diameter D1. The block layer 520 includes a third absorption layer, i.e., an absorption layer 523 includes an iris diaphragm with a third diameter D3 different from the second diameter D2. In an example, the first diameter D1, the second diameter D2 and the third diameter D3 have values that gradually increase or decrease. For example, the block layer 520 has a structure in which a diameter of an aperture 529 gradually changes from one surface of the block layer 520 to another surface of the block layer 520. The number of absorption layers in the block layer 520 is a non-exhaustive example, other number of absorption layers may be used without departing from the spirit and scope of the illustrative examples described.

An example of a constant diameter of an aperture is shown in FIG. 4, FIG. 5 shows an example in which the diameter of the aperture 529 gradually increases. Referring to FIG. 5, diameters of iris diaphragms formed in absorption layers gradually increase, from an absorption layer close to the lens element 510 to an absorption layer far away from the lens element 510. When the diameter of the aperture 529 gradually increases, a maximum angle $\theta_2$ that allows light to pass through the block layer 520 by the aperture 529 increases. In this example, a degree to which the diameter of the aperture 529 increases is determined based on a desired FOV $\theta_1$, a refractive index of the transparent substrate 530, and a refractive index of each of the transparent layers. The degree to which the diameter of the aperture 529 increases is determined based on an angle at which light incident to the transparent substrate 530 is refracted at the desired FOV $\theta_1$ and incident to the block layer 520. The degree to which the diameter of the aperture 529 increases corresponds to a maximum angle $\theta_2$ that allows light to pass through the block layer 520. Thus, a circular iris diaphragm formed in each of a plurality of absorption layers in the block layer 520 has a diameter determined based on the desired FOV $\theta_1$ and a refractive index determined by each of the transparent layer, and the transparent substrate 530.

In an example, the block layer 520 is spaced apart from a sensing element 540 by a focal length of the lens element 510. For example, the block layer 520 is located to face the sensing element 540 based on the lens element 510, as shown in FIG. 5. However, an arrangement of the block layer 520 is not limited thereto, and the block layer 520 is located on the same side as the sensing element 540 based on the lens element 510.

For example, an aperture has a diameter determined based on a quantity of light, and the block layer 520 is spaced apart by a focal length that is determined based on the quantity of light from the sensing element 540.

The example in which the diameter of the aperture 529 gradually increases has been described with reference to FIG. 5, and an example in which a diameter of an aperture gradually decreases is described with reference to FIG. 6 below.

Figure 6:
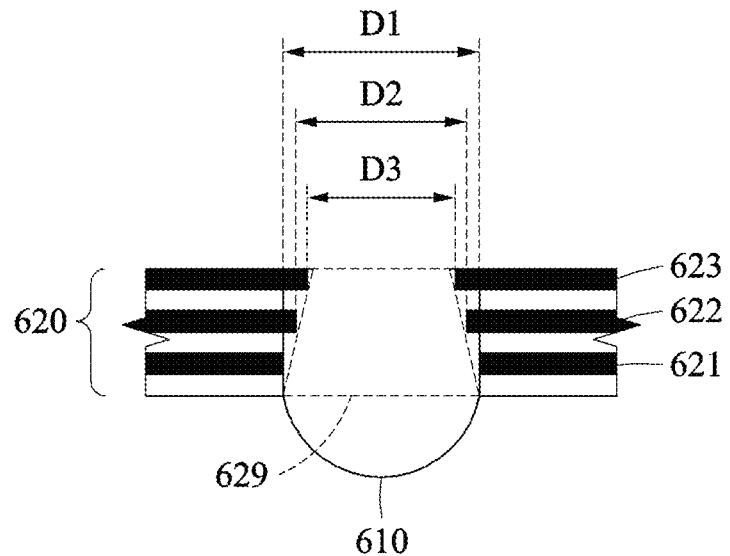
FIG. 6 illustrates another example of a FOV determined by an aperture of a block layer.

FIG. 6 illustrates another example of a FOV determined by an aperture of a block layer.

A block layer 620 includes, based on a lens element 610, a first absorption layer 621 including an iris diaphragm with a first diameter D1, a second absorption layer 622 including an iris diaphragm with a second diameter D2, and a third absorption layer 623 including an iris diaphragm with a third diameter D3. The first diameter D1, the second diameter D2 and the third diameter D3 have values that gradually decrease. For example, the block layer 620 has a structure in which a diameter of an aperture 629 gradually decreases from one surface of the block layer 620 to another surface of the block layer 620. Thus, based on the above-described structure, an image sensor allows a distant object to be observed larger.

Figure 7:
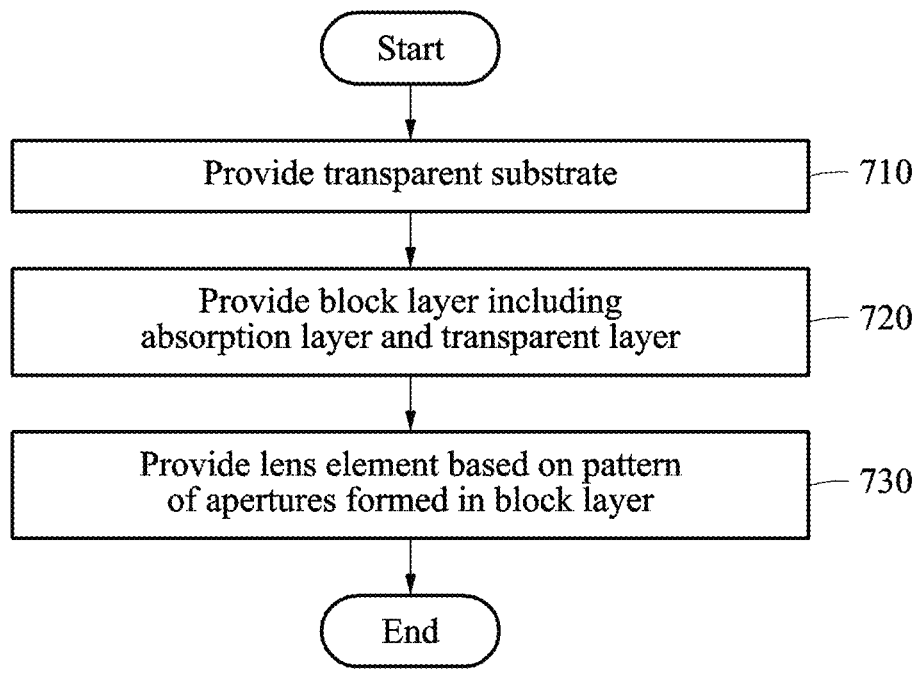
FIG. 7 is a diagram illustrating an example of a method of manufacturing an image sensor.

FIG. 7 is a diagram illustrating an example of a method of manufacturing an image sensor. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. One or more blocks of FIG. 7, and combinations of the blocks, can be implemented by special purpose hardware-based computer that perform the specified functions, or combinations of special purpose hardware and computer instructions. In addition to the description of FIG. 7 below, the descriptions of FIGS. 1-6 are also applicable to FIG. 7, and are incorporated herein by reference. Thus, the above description may not be repeated here.

In an example, an image sensor is formed by sequentially stacking a transparent substrate, a block layer, a lens element, and a sensing element.

Referring to FIG. 7, in operation 710, a transparent substrate is provided. The transparent substrate is a glass wafer as described above, however, examples are not limited thereto.

In operation 720, a block layer including an absorption layer and a transparent layer is provided. For example, the block layer is provided on the transparent substrate. In an example, the absorption layer and the transparent layer are alternately stacked, as described above. An example of forming a block layer will be further described below with reference to FIG. 8.

In operation 730, a lens element is provided based on a pattern of apertures formed in the block layer. For example, the lens element is provided on the block layer. An example of providing a microlens array as a lens element will be further described below with reference to FIG. 9.

Figure 8:
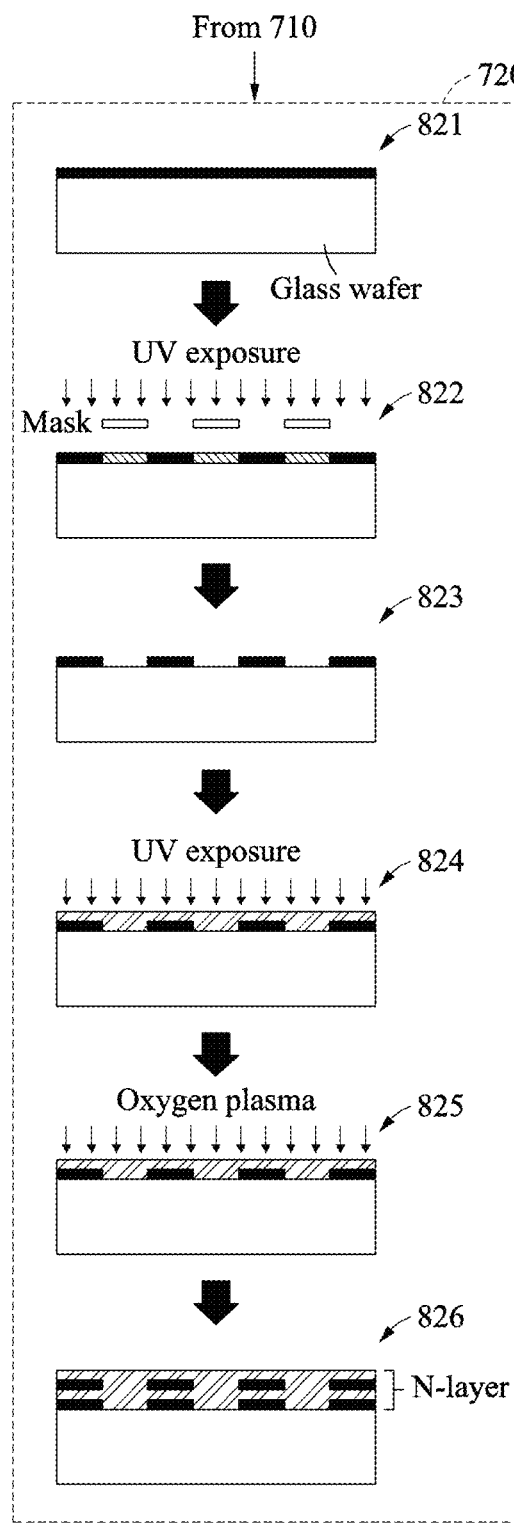
FIG. 8 illustrates an example of providing a block layer.

FIG. 8 illustrates an example of providing a block layer.

Referring to FIG. 8, in operation 821, an absorption layer is provided on a transparent substrate. For example, the transparent substrate is coated with an opaque polymer, such as black polymer (for example, Black SU-8) as an absorption layer.

In operation 822, masks are aligned on the absorption layer. In an example, the masks are disposed in a planar array pattern on the absorption layer. For example, a circular mask is located based on a grid pattern. Ultraviolet (UV) rays are emitted with the masks aligned on the absorption layer. A portion of the absorption layer excluding the masks is exposed to UV rays. The absorption layer includes a negative photoresist. A photoresist is a photosensitive material used in various processes, and forms a patterned coating on a surface.

In operation 823, the absorption layer patterned by UV exposure is developed by a developer. In an example, a solvent called a "developer" is applied onto a surface. A portion of the negative photoresist exposed to UV rays is insoluble in the developer. A portion of the negative photoresist that is not exposed to UV rays is dissolved by a photoresist developer. Thus, as shown in FIG. 8, portions of the absorption layer corresponding to shapes of the masks are dissolved and removed.

In operation 824, the patterned absorption layer is coated with a transparent layer. The block layer is exposed to UV rays with the transparent layer coated on the patterned absorption layer. The transparent layer also includes a negative photoresist, and a portion of the transparent layer exposed to UV rays is insoluble in the developer. Because all portions of the transparent layer are exposed to UV rays without a mask, the transparent layer is fixed.

In operation 825, a hydrophilic process is applied to the transparent layer. Through the hydrophilic process, a bonding force between the transparent layer and the absorption layer increases. The hydrophilic process is, for example, an oxygen plasma process.

In operation 826, a plurality of layers (for example, "N" layers) are stacked by repeating operations 821 through 825. "N" is an integer greater than or equal to "2". Absorption layers and transparent layers are alternately stacked. While operations 821 through 825 are repeated, an alignment between patterns formed for each absorption layers is maintained. Thus, a set of iris diaphragms formed for each absorption layers corresponds to an aperture.

Figure 9:
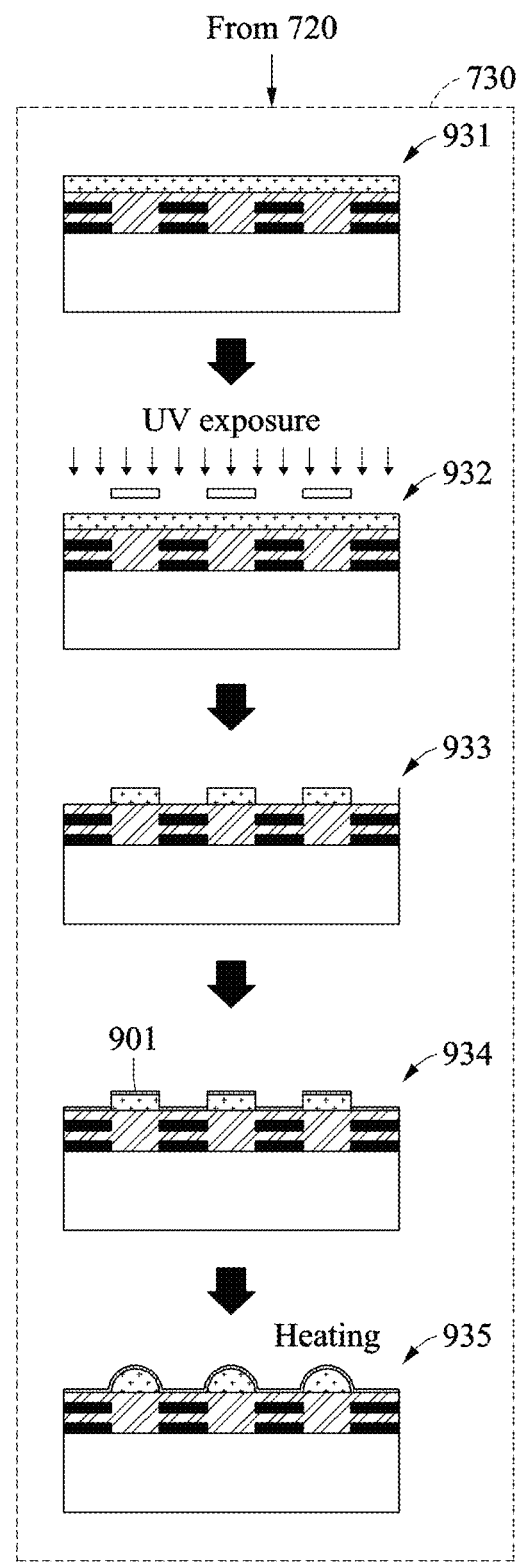
FIG. 9 illustrates an example of a method of providing a lens element.

FIG. 9 illustrates an example of providing a lens element.

Referring to FIG. 9, in operation 931, a thermoplastic polymer is provided on a block layer. The thermoplastic polymer is a transparent material to manufacture a lens, and a material moldable by heat. For example, the thermoplastic polymer is AZ9260.

In operation 932, masks arranged in a pattern with respect to a planar array pattern formed on an absorption layer are disposed on the thermoplastic polymer. The thermoplastic polymer is exposed to UV rays with the masks disposed on the thermoplastic polymer.

In operation 933, the thermoplastic polymer patterned by UV exposure is developed by a developer. For example, the thermoplastic polymer is a positive photoresist, and a portion of the positive photoresist exposed to UV rays is dissolved by a photoresist developer. A portion of the positive photoresist that is not exposed to UV rays is insoluble in the developer. Thus, as shown in FIG. 9, portions of the thermoplastic polymer corresponding to shapes of the masks remain unchanged after UV exposure. For example, when a circular mask is used, the thermoplastic polymer is maintained in a form of a cylinder based on a planar array pattern.

In operation 934, a hydrophobic coating 901 (for example, a fluorocarbon nanofilm coating) is applied to a structure in which the thermoplastic polymer is patterned. A cohesive force of the thermoplastic polymer increases by the hydrophobic coating 901.

In operation 935, a microlens array is manufactured through a thermal reflow process. Because the cohesive force of the thermoplastic polymer increases by the hydrophobic coating 901 of operation 934, the thermoplastic polymer aggregates in a form of a sphere.

However, an example of manufacturing an image sensor is not limited to FIGS. 7 through 9, and may vary depending on a design. Also, an order of operations of each of manufacturing processes described above with reference to FIGS. 7 through 9 is not limited to the above description and the order may be changed. In some embodiments, a portion of the processes may be omitted or added.

Figure 10:
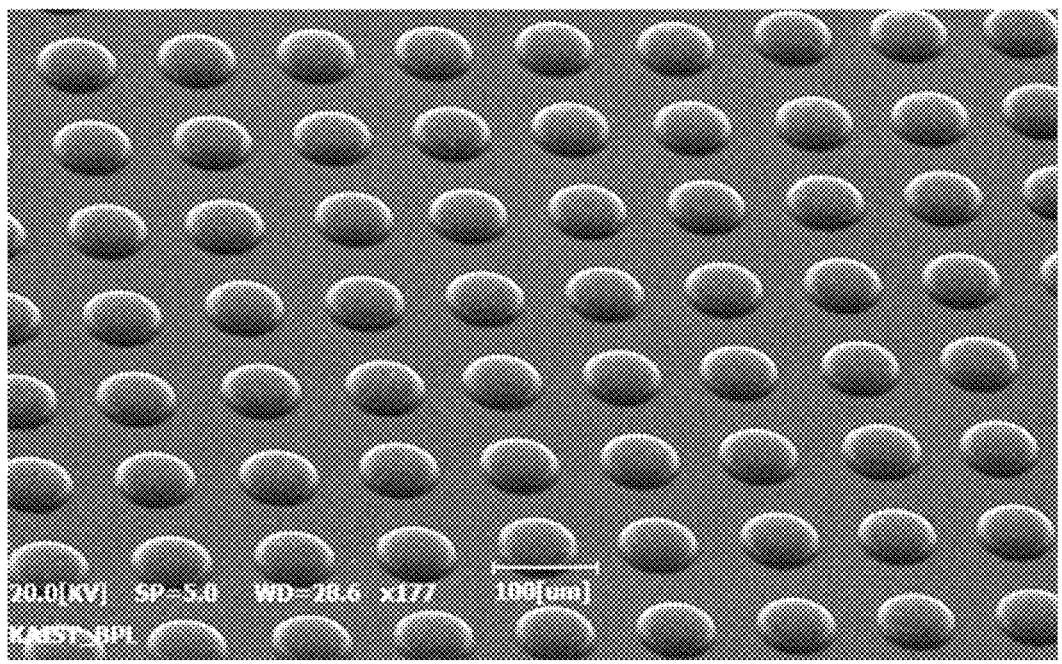
FIG. 10 illustrates an example of an image acquired by capturing a structure in which a lens element is integrated on one surface of a block layer, using an electronic scanning electron microscope.

FIG. 10 illustrates an example of an image acquired by capturing a structure in which a lens element is integrated on one surface of a block layer, using an electronic scanning electron microscope.

FIG. 10 illustrates lens elements captured by the electronic scanning electron microscope. In FIG. 10, spherical lens elements are uniformly formed in a grid pattern below the block layer.

Figure 11:
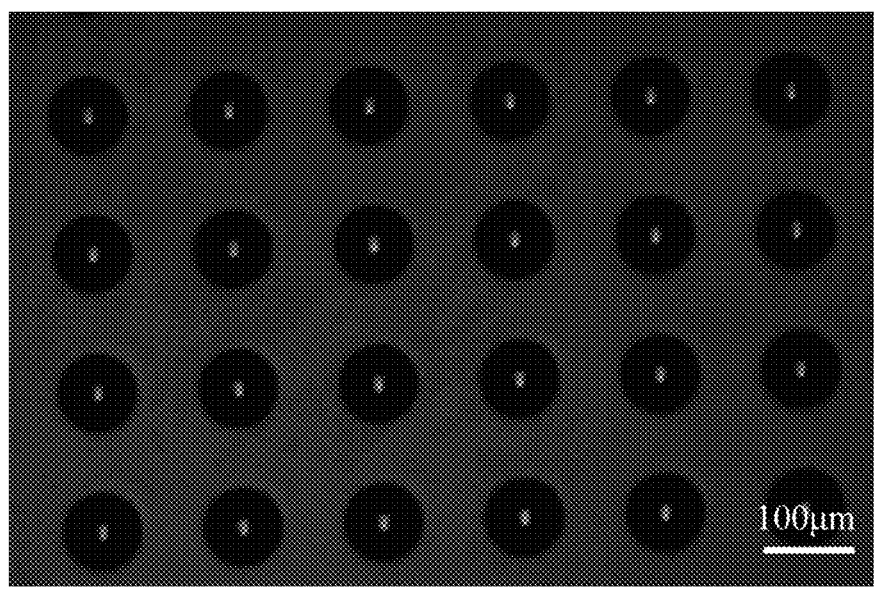
FIG. 11 illustrates an example of an image acquired by capturing a structure in which a lens element is integrated on one surface of a block layer, using an optical microscope.

FIG. 11 illustrates an example of an image acquired by capturing a structure in which a lens element is integrated on one surface of a block layer, using an optical microscope.

FIG. 11 illustrates lens elements captured by the optical microscope. In FIG. 11, focal points of lens elements are uniformly formed and are indicated by white dots.

Figure 12:
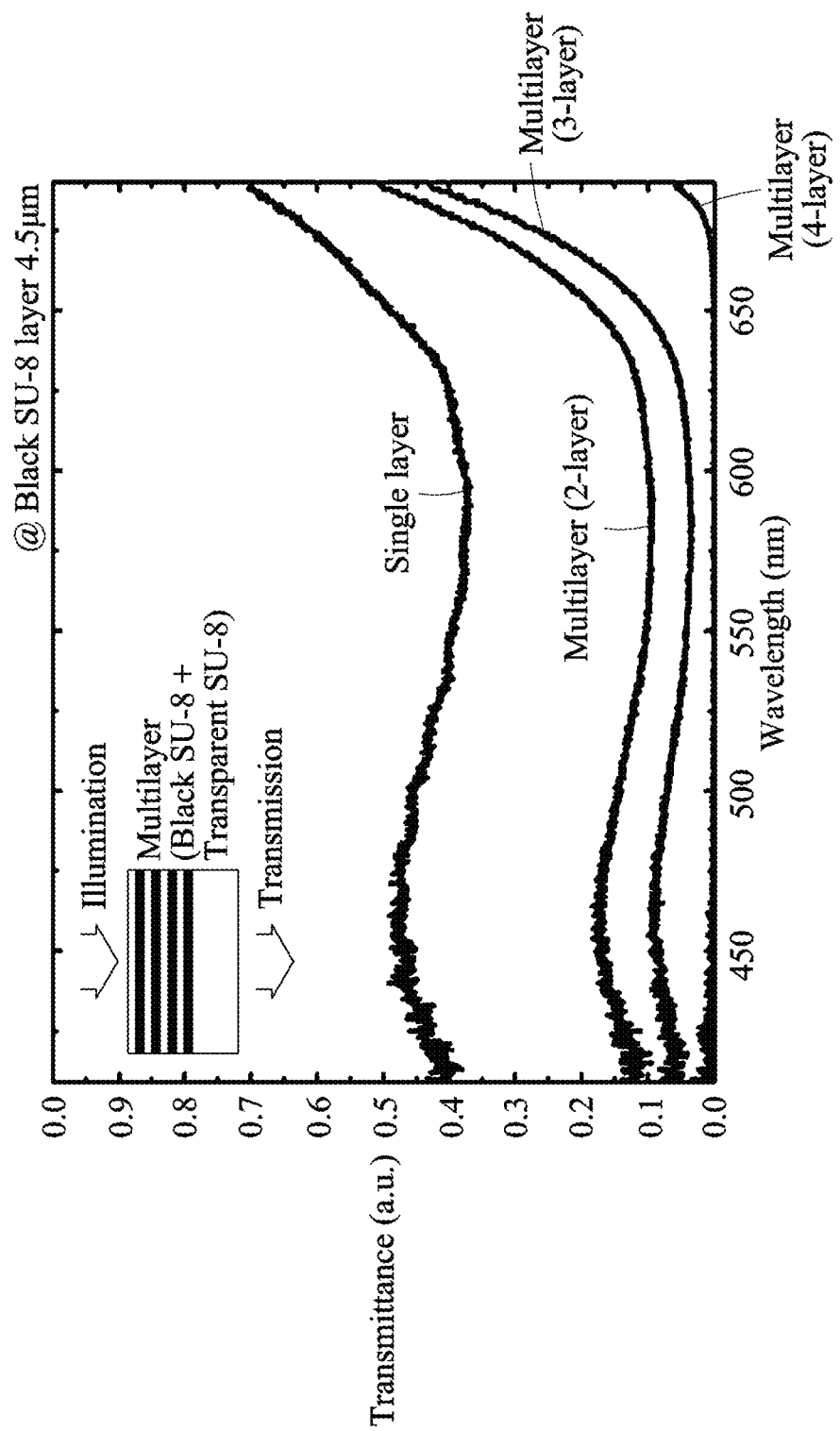
FIG. 12 illustrates an example of a transmittance of light based on a number of absorption layers included in a block layer.

FIG. 12 illustrates an example of a transmittance of light based on a number of absorption layers included in a block layer.

FIG. 12 illustrates a result indicating that a transmittance of light passing through the block layer decreases when the number of absorption layers included in the block layer increases. For example, when coating with an absorption layer of 4.5 µm is performed, about 40% to 50% of light is transmitted through a single layer. About 10% of light is transmitted through two layers. Light in a visible light region is barely transmitted through four layers.

Figure 13:
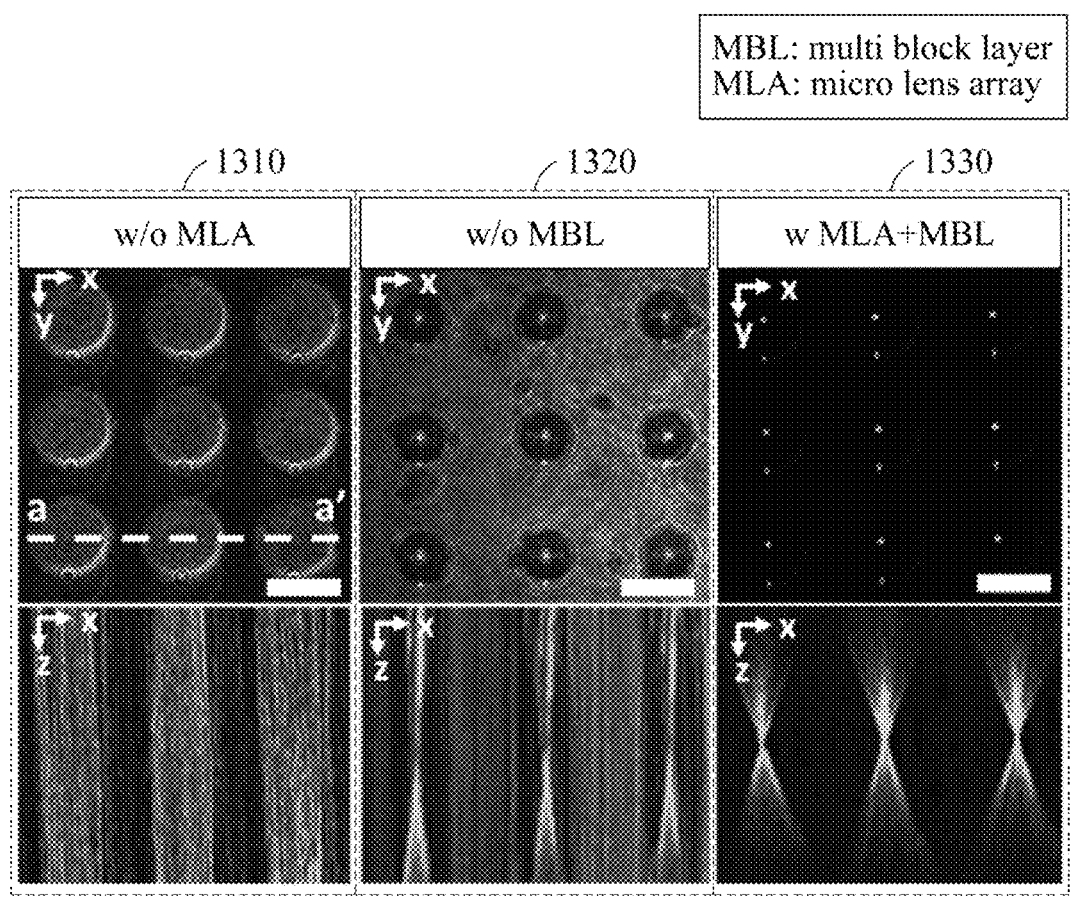
FIG. 13 illustrates an example of images acquired by capturing a top surface and a side of an image sensor, using a confocal laser scanning microscope.

FIG. 13 illustrates an example of images acquired by capturing a top surface and a side of an image sensor, using a confocal laser scanning microscope.

The images of FIG. 13 acquired using the confocal laser scanning microscope represent a structure 1310 without a lens array, a structure 1320 without a block layer, and a structure 1330 with a lens array and a block layer.

In the structure 1310, a path of light is not focused. In the structure 1320, light is not blocked.

In the structure 1330, a path of light is focused, and light is blocked in portions other than apertures.

Figure 14:
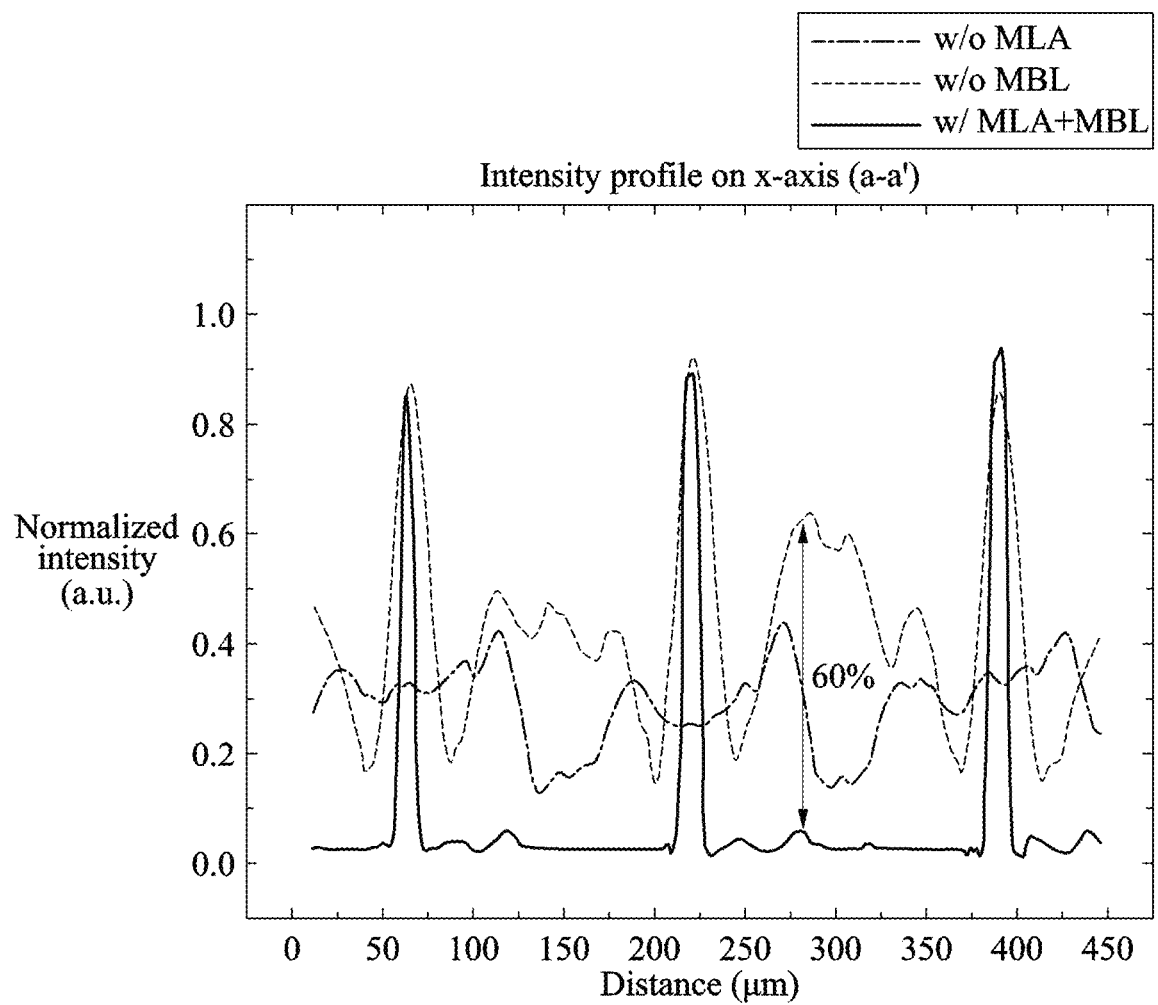
FIG. 14 illustrates an example of an intensity profile of an image sensor.

FIG. 14 illustrates an example of an intensity profile of an image sensor.

FIG. 14 illustrates a comparison result of intensity profiles of the structures 1310 to 1330 of FIG. 13. In FIG. 14, the broken line w/o MLA represents an intensity profile without microlens array, the broken line w/o MBL represents an intensity profile without multi-block layer, and the solid line w MLA+MBL represents an intensity profile with both microlens array and multi-block layer. An image sensor blocks light about 60% more effectively than a structure without a block layer. Also, in terms of a focal point, the image sensor exhibits a uniform quantity of light. The uniform quantity of light indicates that lenses are uniformly manufactured.

FIG. 15 illustrates an example of an image acquired by an image sensor.

By capturing an original image shown in a top portion of FIG. 15 using the image sensor, an image shown in a bottom portion of FIG. 15 is obtained. The image sensor acquires a plurality of sharp split images while preventing crosstalk using a block layer.

Figure 16:
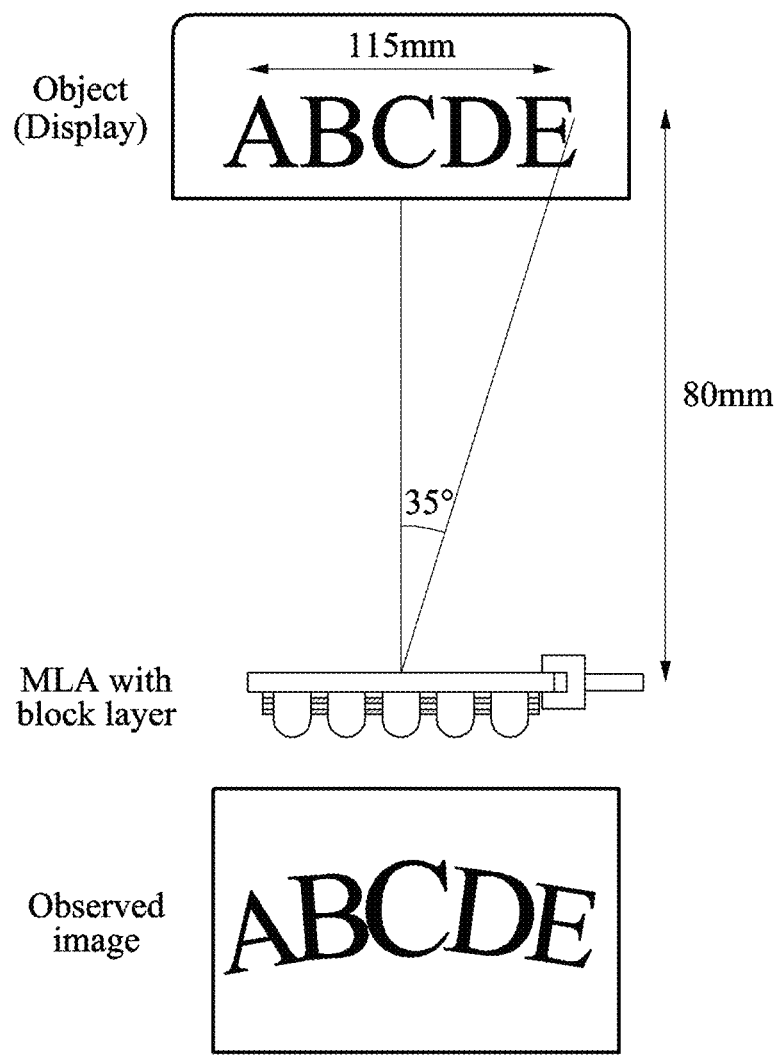
FIG. 16 illustrates an example of a result obtained by measuring a FOV of an image sensor.

FIG. 16 illustrates an example of a result obtained by measuring a FOV of an image sensor.

When the image sensor captures a target object image, the FOV of the image sensor is measured from a length of the target object image, and a distance that allows a user to observe an image that is full of an object and that is captured by the image sensor. The FOV of the image sensor is about 70° as shown in FIG. 16.

Figure 17:
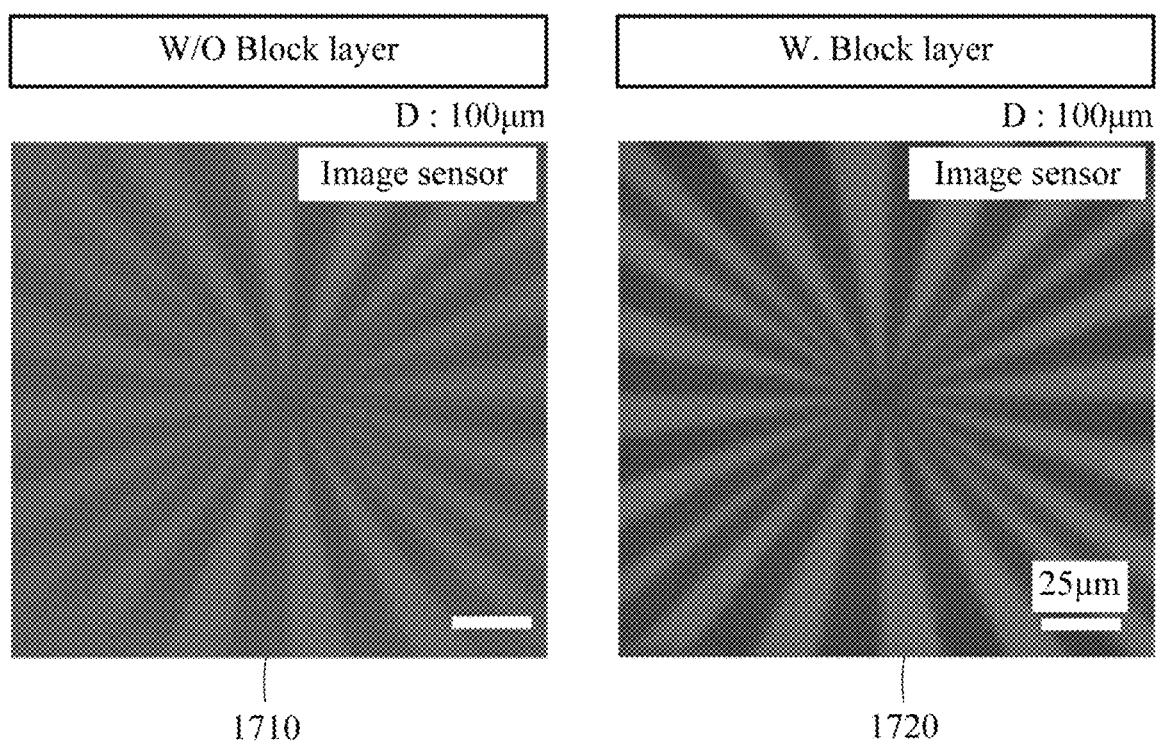
FIGS. 17 and 18 illustrate an example of an influence of a block layer on a modulation transfer function (MTF).
Figure 18:
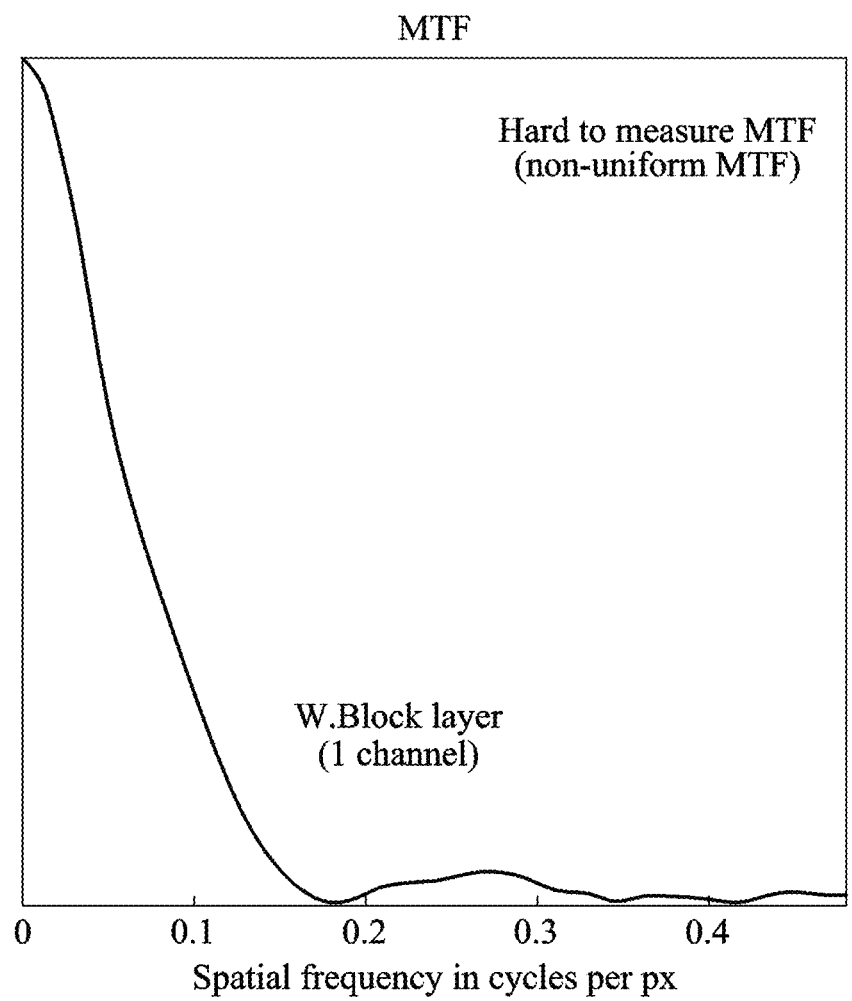

FIGS. 17 and 18 illustrate an example of an influence of a block layer on a modulation transfer function (MTF).

FIG. 17 illustrates an MTF measurement image of a structure 1710 without a block layer, and an MTF measurement image of a structure 1720 with a block layer. The MTF measurement image of the structure 1710 has a relatively low sharpness, however, the MTF measurement image of the structure 1720 has a relatively high sharpness. As shown in FIG. 18, it is possible to measure an MTF for an image sensor of a structure with a block layer.

According to examples, an image sensor disclosed herein is mounted in an ultrathin camera application product, for example, a mobile digital camera. Also, the image sensor is applicable to other imaging equipment, such as, subminiature optical imaging equipment, for example, endoscopy cameras or drones.

According to examples, in an image sensor, an absorption layer to prevent optical crosstalk is located to face a sensing element based on a lens element, and an empty space between the lens element and the sensing element is maintained by a spacer. Thus, it is possible to implement a thin image sensor.

According to examples, an image sensor reduces optical crosstalk using a block layer that includes an absorption layer and a transparent layer. Also, a FOV of the image sensor is adjusted during the manufacturing of the image sensor.

According to examples, in an image sensor, a lens element is located on a bottom surface of a block layer. Because the block layer is located on the lens element, optical crosstalk is reduced. Also, a transparent substrate is located on the block layer in the image sensor. Because the transparent substrate is located on the block layer, received light is refracted, to effectively increase a FOV of the image sensor. The FOV is adjusted based on a thickness of a transparent layer and a number of absorption layers that are stacked. Also, a diameter or a width of an iris diaphragm formed in one absorption layer is designed to be different from a diameter or a width of an iris diaphragm formed in another absorption layer, and thus the FOV is determined.

According to examples, an image sensor is integrated in a semiconductor to be used as an ultrathin camera. Also, a quantity of light received by the image sensor is adjusted by designing a width of an iris diaphragm formed in each of stacked absorption layers and an f number of a lens element.

According to examples, the method of manufacturing an image sensor enables the manufacture of a precise image sensor using a material that enables UV patterning. Also, the method of manufacturing an image sensor enables the manufacture of an ultrathin lens. Iris diaphragms formed in absorption layers are set to have different diameters, and thus, it is possible to adjust a FOV at which light is received. Also, a focal length based on a curvature of a lens element and a height of a spacer may vary depending on a design.

According to examples, it is possible to adjust a FOV of an image sensor with respect to individual sensing elements included in a sensor array by designing a lens element and a block layer that provide light to the individual sensing elements. The image sensor acquires a plurality of split images using a plurality of sensing elements. The image sensor acquires split images with an adjusted degree of overlapping based on an adjustment of the FOV by designing the block layer as described above. The image sensor enhances an MTF for high-quality ultrathin cameras, or extracts three-dimensional (3D) depth information for 3D cameras.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor comprising:
   a block layer comprising an absorption layer and a transparent layer, and the block layer being configured to transmit light through an aperture formed in the absorption layer and the transparent layer;
   a lens element located under the block layer; and
   the lens element is configured to receive light passing through the block layer and to transfer the light to a sensing element,
   wherein the absorption layer and the transparent layer are alternately disposed in the block layer.

2. The image sensor of claim 1, wherein the sensing element is spaced apart from the lens element, and the sensing element is configured to receive the light passing through the aperture and the lens element.

3. The image sensor of claim 1, wherein the lens element is further configured to refract the light and to form a focal point on the sensing element, and
   a protrusion is formed on one surface of the lens element and faces the sensing element.

4. The image sensor of claim 1, wherein the block layer is spaced apart by a focal length of the lens element from the sensing element.

5. The image sensor of claim 1, further comprising:
   a transparent substrate configured to transmit light.

6. The image sensor of claim 5, wherein the transparent substrate is disposed on a first side of the block layer and the lens element is disposed on a second side of the block layer, opposing the first side.

7. The image sensor of claim 1, wherein the aperture is located in the block layer to correspond to an arrangement of the lens element.

8. The image sensor of claim 1, further comprising:
   a spacer configured to maintain an interval between the block layer and the sensing element.

9. The image sensor of claim 1, wherein the absorption layer comprises a circular iris diaphragm centered on a point corresponding to the lens element.

10. The image sensor of claim 1, wherein
    the absorption layer comprises an iris diaphragm with a first diameter centered on a point corresponding to the lens element, and
    the block layer further comprises another absorption layer with another iris diaphragm with a second diameter different from the first diameter.

11. The image sensor of claim 1, wherein a diameter of the aperture gradually changes from one surface to another surface of the block layer.

12. The image sensor of claim 1, wherein the transparent layer is configured to transmit light in a wavelength band.

13. The image sensor of claim 1, wherein the block layer has a height based on a field of view (FOV).

14. The image sensor of claim 1, wherein a number of absorption layers stacked in the block layer is determined based on a field of view (FOV).

15. The image sensor of claim 1, wherein a diameter of the aperture is based on a quantity of the light, and the block layer is spaced apart from the sensing element by a focal length determined based on the quantity of the light.

16. The image sensor of claim 1, wherein the transparent layer comprises a transparent polymer configured to transmit light.

17. The image sensor of claim 1, wherein the absorption layer comprises a black matrix material configured to absorb light.

18. The image sensor of claim 1, wherein the block layer comprises a plurality of absorption layers, and a circular iris diaphragm formed in each of the plurality of absorption layers has a diameter that is determined based on a field of view (FOV) and a refractive index determined by the transparent layer and a transparent substrate disposed on the block layer.

19. The image sensor of claim 1, wherein
the lens element and the sensing element are arranged in a planar array pattern, and
the absorption layer comprises an iris diaphragm arranged based on the planar array pattern.

20. A method of manufacturing an image sensor, the method comprising:
providing a transparent substrate;
providing a block layer comprising an absorption layer and a transparent layer; and
providing a lens element based on a pattern of apertures formed in the block layer,
wherein the lens element is located under the block layer, and configured to receive light passing through the block layer and to transfer the light to a sensing element, and
wherein the absorption layer and the transparent layer are alternately disposed in the block layer.

21. A method of manufacturing an image sensor, the method comprising:
disposing a block layer comprising an absorption layer and a transparent layer on a transparent substrate; and
providing a lens element corresponding to a pattern of apertures formed in the block layer,
wherein the lens element is located under the block layer, and configured to receive light passing through the block layer and to transfer the light to a sensing element, and
wherein the disposing of the block layer comprises:
coating the transparent substrate with an opaque polymer;
disposing a mask with the pattern on a portion of the opaque polymer;
emitting ultraviolet (UV) rays to the opaque polymer exposed through the pattern of the mask;
removing the portion of the opaque polymer covered with the mask;
coating a transparent layer comprising a negative photoresist over and between a remaining opaque polymer; and
exposing the transparent layer to UV rays.

22. The method of manufacturing of claim 21, further comprising increasing a bonding between the transparent layer and the remaining opaque polymer by performing a hydrophilic process.

23. The method of manufacturing of claim 21, wherein the mask comprises a circular mask with a grid pattern.

24. The method of manufacturing of claim 21, wherein the coating comprises a negative photoresist.

25. The method of manufacturing of claim 21, wherein the providing of the lens element comprises:
coating a thermoplastic polymer layer comprising a positive photoresist on the block layer;
disposing a mask with the pattern on a portion of the thermoplastic polymer layer;
exposing the thermoplastic polymer layer to ultraviolet (UV) rays through the pattern of the mask;
dissolving the thermoplastic polymer layer exposed to UV rays by a developer;
applying a hydrophobic coating to the patterned thermoplastic polymer layer; and
heating the coated thermoplastic polymer layer to form spherical lenses.

26. The method of manufacturing of claim 25, wherein the thermoplastic polymer layer comprises a transparent material moldable by heat.

27. An image sensor comprising:
a block layer comprising absorption layers and transparent layers alternatively stacked together;
a lens element located under the block layer;
an aperture formed in the absorption layers and the transparent layer to transfer light to a lens element; and
a sensing element spaced apart from the lens element, and being configured to receive the light from the lens element,
wherein the lens element is configured to receive light passing through the block layer and to transfer the light to a sensing element.

28. The image sensor of claim 27, wherein a diameter of the aperture gradually changes between two opposing surfaces of the block layer.

29. The image sensor of claim 27, wherein the aperture comprises circular openings in each of the absorption layers, and a diameter of the circular openings are based on a field of view (FOV) and a refractive index determined by the transparent layers and a transparent substrate disposed on the block layer.

30. The image sensor of claim 27, further comprising a spacer located at an outer boundary of the block layer and the sensing element, the spacer being configured to maintain an interval substantially equal to a focal length of the lens element between the block layer and the sensing element.

* * * * *